United States Patent [19]
Sharma et al.

[11] Patent Number: 5,990,547
[45] Date of Patent: Nov. 23, 1999

[54] SEMICONDUCTOR DEVICE HAVING PLATED CONTACTS AND METHOD THEREOF

[75] Inventors: Laxminarayan Sharma; Burton J. Carpenter, both of Austin, Tex.

[73] Assignee: Motorola, Inc., Schaumburg, Ill.

[21] Appl. No.: 09/033,048

[22] Filed: Mar. 2, 1998

[51] Int. Cl.⁶ .................................................. H01L 23/053
[52] U.S. Cl. .......................... 257/700; 257/691; 257/780; 257/698; 257/784
[58] Field of Search .................................... 257/700, 738, 257/779, 780, 691, 758, 701, 774; 361/780, 794, 795

[56] References Cited

U.S. PATENT DOCUMENTS 5,468,999  11/1995  Lin et al. ................................. 257/784
5,640,048   6/1997  Selna ....................................... 257/738

Primary Examiner—Tom Thomas
Assistant Examiner—Luan Thai
Attorney, Agent, or Firm—James L. Clingan, Jr.

[57] ABSTRACT

A package substrate (11) having access to a plating bus (36, 38) through intermediate routing layers (4, 6). Specifically, electrical contact between a solder pad (16, 19, 51), and its respective bond post (27), if any, is made by routing a trace (32, 52) through an intermediate routing layer (4, 6). The trace (32, 52) begins within a final package dimension (10) and extends to a peripheral portion (12) which is excised during manufacturing. There is a conductive trace (32, 52) visible from the side of the final packaged device (10').

8 Claims, 7 Drawing Sheets

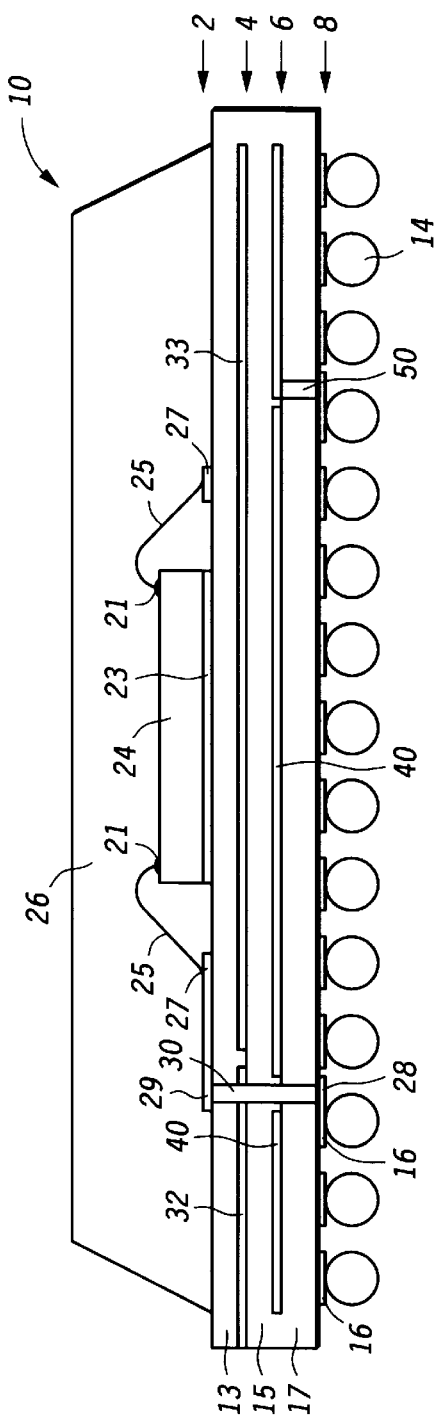
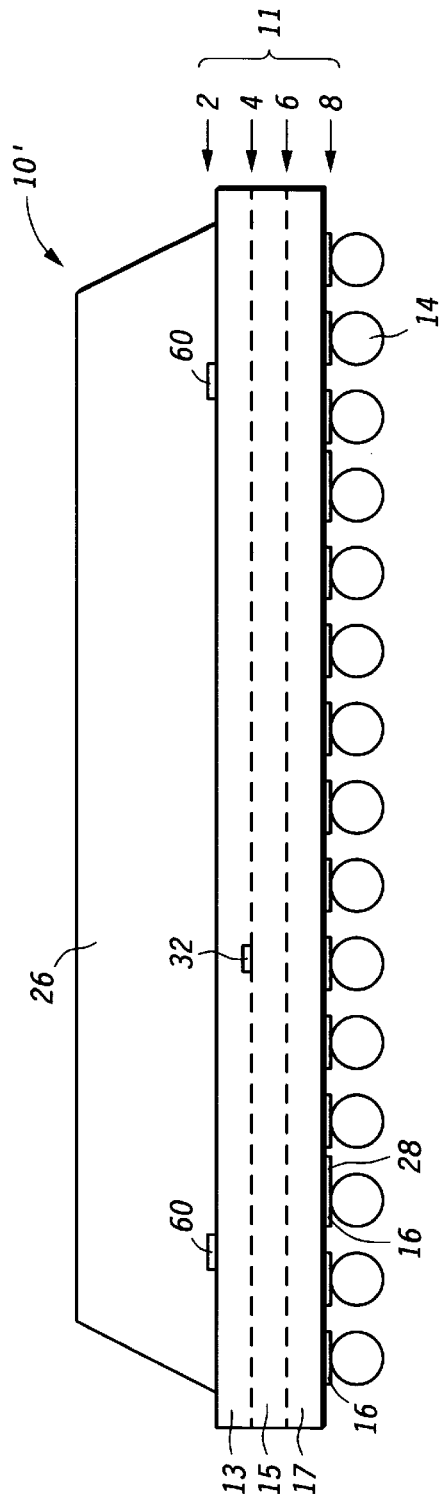
FIG.5
FIG.6

SEMICONDUCTOR DEVICE HAVING PLATED CONTACTS AND METHOD THEREOF

FIELD OF THE INVENTION

The present invention relates generally to the packaging of a semiconductor device, and specifically to the packaging of a semiconductor device in a multilayered package structure wherein the external package contacts are plated using an electrolytic method.

BACKGROUND OF THE INVENTION

Advancements in technology in the semiconductor industry have created a need for very high pin count packages. Traditionally, semiconductor packages were wire bonded from a semiconductor die to a package substrate wherein the final package substrate had external electrical contacts which could be accessed by users. As designs have become more complex, the need for more Inputs and Outputs (I/O) has surpassed the ability to provide the additional I/O by conventional wire bond methods. Therefore, advanced packaging techniques, such as direct die attach, have been developed. With direct die attach techniques, such as flip chip, the die is attached directly to the packaged substrate which in turn provides the necessary electrical traces to the external contacts to the device.

One high I/O package is a Ball Grid Array package (BGA). A BGA package when viewed from the underside has a full or partial array of solder balls attached. The BGA package in turn can be attached to a printed circuit board by an end user. While the array structure of the BGA package allows for a high number I/O, there are problematic issues associated with routing the trace signals from the bonding fingers which attach to the die. One method of overcoming the routing problem associated with die bonding large I/O packages to BGAs has been to use the direct die attach packages previously discussed. By eliminating the space used by the wire bonding posts or fingers and the wire bonds themselves, additional routing space can be obtained allowing greater optimization during routing. However, the use of direct die attached technology can be expensive. For example, depending upon the size of a die, the use of a C-4 process in manufacturing a semiconductor device can result in a die cost in excess of five times greater than the die cost associated with a traditional wire bonded semiconductor die.

Another solution to improve routability is to add additional routing layers to the package. However, adding additional routing layers to the package increases the overall cost of the package. Therefore, one of the problems associated with high pin count packages are the additional costs that can be required either in the package device design, or the semiconductor device design.

Another problem associated with the use of BGA packages is that during the packaging process, it is necessary to plate the solder pads and/or the bond posts using an electrolysis method. Generally, Nickel/Gold is used in this electroplating process to provide a wire bondable surface and to protect the solder pads from atmospheric corrosion. The process of electrolytically plating the solder pads requires an electrical connection to each one of the solder pads of the BGA package. As a result, it is necessary to form an electrical connection from each wire bond post and BGA solder pad to an external electroplating bus. The need for this electroplating connection requires additional routing, including plating traces, from the bond fingers, vias, or the solder pads associated with the package. In the prior art, the top and bottom layer of the BGA package have plating busses for making electrical contact to each solder pad during electroplating. Generally, the plating busses run the entire periphery of the device being processed. Plating traces are connected to one of the plating busses in order to create the contact needed.

By making an electrical connection to the plating bus, each of the wire bond post and BGA package solder balls can be electrically contacted thereby allowing the electroplating process. However, availability of routing space for the functional traces is further limited by the need for electroplating traces, especially, where large pin counts, large die, and the need for smaller substrates exists. In addition, the problem of routing the plating traces needed to allow for electroplating is made more difficult based upon pin to ball assignments which can be specified by the designers of the semiconductor devices. Therefore, a new routing scheme which does not require additional cost to the packaging, and allows for more efficient routing of the plating traces would be desirable.

BRIEF DESCRIPTION OF THE DRAWINGS

FIG. 5 illustrates a cross section of the package substrate of FIG. 1 following removal of a portion of the package substrate;

FIG. 6 illustrates a side view of the package substrate of FIG. 5;

Figure 1:
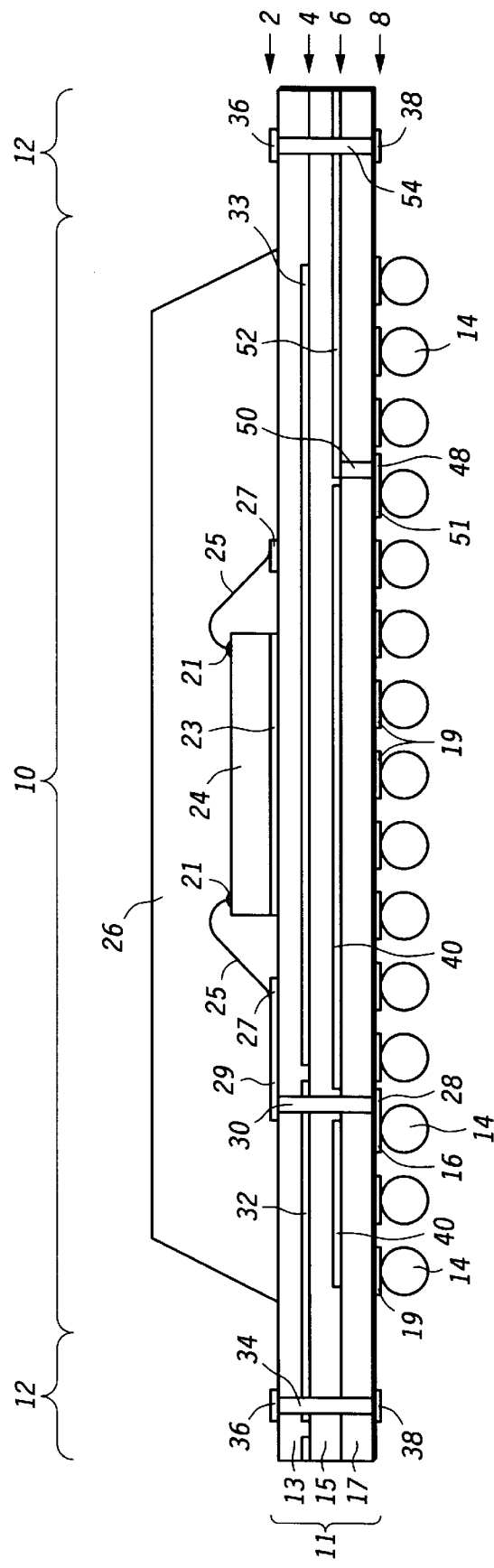
FIG. 1 illustrates as cross sectional view of a package substrate having a plating bus, and a semiconductor device attached to the substrate.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF THE DRAWINGS

The present invention discloses a package substrate having access to a plating bus through intermediate routing layers. Specifically, electrical contact between a solder pad, and its respective bond post, if any, is made by routing a trace through an intermediate routing layer. The trace begins within a final package dimension and extends to a peripheral portion which is excised during manufacturing. The end result is that, unless a subsequent coating step occurs, there is a conductive trace visible from the side of the final packaged device. This allows routing congestion at the bond post layer to be reduced.

FIG. 1 illustrates a pre-excised packaged device in accordance with the present invention. The pre-excised packaged device of FIG. 1 includes a main body portion 10, and a peripheral portion 12. There is a substrate portion 11 which extends across both the main body portion 10 and the peripheral portion 12. The substrate portion 11, in the embodiment illustrated, comprises three separate dielectric insulation layers 13, 15 and 17. Other embodiments of the present invention can have substrates with more than three layers. The substrate portion 11 has four metal routing layers 2, 4, 6 and 8. The metal routing layers 2 and 8 are formed on the outer surfaces of the respective layers 13 and 17, while the routing layer 4 is formed between layers 13 and 15, and routing layer 6 is formed between the layers 15 and 17. Routing layers 2 and 4 may be covered with another layer such as a solder mask (not shown).

The main body portion 10 represents a final package dimension which is the portion of the package that remains when all packaging processes are complete. The completed package would generally include a die attach flag 23 which is part of the routing layer 2. The die attach flag 23 is positioned relative to the substrate 11, such that it can receive the die 24. The die 24 is attached to the flag 23. Once attached to the substrate 11, a wire bonding process can be used to electrically attach the die 24 to the substrate 11. In order to accomplish the wire bond, bond posts 27 are formed at the routing layer 2 of the substrate 11. The die 24 has bond pads 21. Bond wires 25 are used to form an electrical connection between the bond pads 21 and the bond post 27. Subsequent to all of the die bond pads 21 being connected to their corresponding bond posts 27, the combination of the substrate 11 and attached die 24 is submitted to a process whereby a molding compound 26 is formed over the die 24. Generally, the molding compound 26 will be formed over at least a portion of top surface of the substrate 11 such that it substantially covers any routing traces on layer, 2 as well as any vias which may extend through to layer 2. In the embodiment illustrated, the molding compound 26 extends out past the furthest solder ball attached to the device of FIG. 1.

Other embodiments of the present invention can include multiple layer of bond posts, and routing at layer 2 which connects to the plating bus 36.

During the packaging process, the solder balls 14 are attached to the substrate 11. Generally, the solder balls 14 are attached to solder pads 19 which are formed at the layer 8 level. In order to assure a quality bond between the solder balls 14 and the solder pads 16, 19, 51, it is necessary to plate the solder pads 19 prior to formation of the solder balls. The plating process is accomplished through the use of plating busses 36, 38 which are electrically connected to each one of the solder pads the device of FIG. 1. By electrically biasing the plating busses 36, 38 it is possible to use an electrolytic method to plate the connected bond posts 27 and the solder pads 16, 19, 51.

The connections to the plating buses 36, 38, are accomplished through the use of the surface routing layers 2 and 8. Generally, the layers 4 and 6 are voltage reference layers which in a specific embodiment include a ground layer and a power layer connected to Vss and Vdd respectively. In one embodiment of the present invention, the use of a vias 54 and 34 is such that the vias 54 and 34 provide an electrical contact between at least one of the voltage reference layers 4, 6 and the plating bus 36, 38. For example, the solder pad 16 is connected to a short trace 28 at layer 8. The trace 28 in turn, is connected to a via 30 which makes contact with an isolated trace 32 at routing layer 4 and trace 29 at layer 2. The trace 32 in turn makes contact with the via 34 which is a through hole via. The through hole via 34 makes contact to both of the plating buses 36 and 38.

This specific structure gives several advantages over the prior art. One advantage is that more routing space is available by using isolated traces on the voltage reference layers 4 and 6. This is advantageous because it allows for higher pin count devices to be processed using wire bond techniques by removing traces from the surface layers 2 and 8 of the device to the plating busses 36 and 36. By removing traces from the surfaces 2 of portion 10, there is more room to place pond posts 27 upon the substrate. More bond posts translate into more I/O. Another advantage over the use of the vias 34 and 54 is that it is not necessary for the trace 32 to be routed through another via to the upper or lower routing layers 2, 8 respectively. Therefore, the number of vias needed are reduced by placing a via outside of the active package area 10. Reducing the number of vias in the active package area gives more routing space which translated to more I/O's. In another embodiment, additional busses similar to busses 35 and 36 can be formed on the intermediate layer 4 and 6.

Solder pad 16 is shown to be coupled to the bond post 27. In addition, there is a solder ball 14 attached to the solder pad 16 for providing an external electrical contact to the semiconductor die 24. Since it is necessary for each one of the solder pads to be electroplated, it is necessary to provide a connection to the plating bus 36, 38 whether or not there is an actual connect associated between a given solder pad and the die 24. For example, solder pad 51 is illustrated to be a non-connected pad, in that it is not electrically connected to the die 24. However, solder pad 51 is connected through trace 48, via 50, and trace 52 to via 54 which makes contact to the plating buses 36 and 38. It should be noted, that the connection to the plating busses 36 and 38 can be made in accordance with the present invention through any intermediate metal layer. The intermediate metal layers 4 and 6 represent routing layers, or individual power and ground layers, such as in the specific embodiment herein described. Generally, it is advantageous to maintain routing to the plating bus 35, 38 at a single layer 4, 6 if possible. By using a single layer an advantage is realized because more routing space in layers 2 and 8 is available, and the number of vias is minimized. Therefore, once the trace 52 was initially created at the layer 6, it is advantageous to maintain the trace 52 at layer 6 before a contact is made to via 54.

As indicated earlier, the peripheral portion 12 is not part of the finished die. Therefore, following the use of the plating busses 36 and 36 to electrolytically plate the solder posts and solder pads, the portion 12 is removed.

Figure 2:
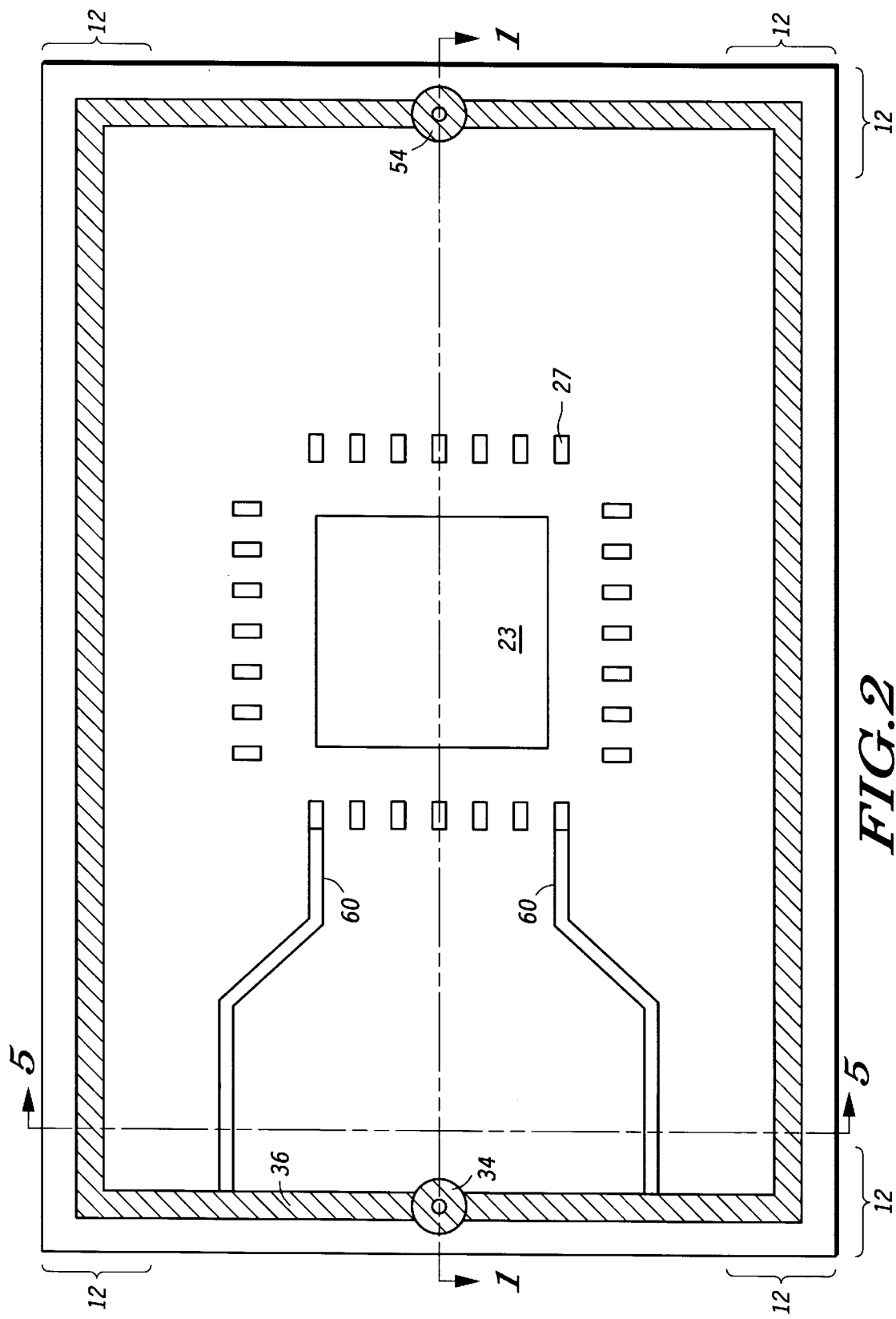
FIG. 2 illustrates a plan view of the package substrate of FIG. 1.

FIG. 2 illustrates a plan view of the device of FIG. 1 corresponding to the routing layer 2. The plating bus 36 extends around the peripheral of routing layer 2. The plating bus 36 is connected to the two vias 34 and 54. It is understood however that there may be other vias connecting to the plating bus 36 at other locations along the plating bus. However, in the present embodiment only two vias are illustrated. In addition, at layer 2 a flag 23 is illustrated. The die 24 of FIG. 1 is attached to the flag 23. In addition, bond posts 27 for wire bonding to the die 24 of FIG. 1 are illustrated. It should be noted that the features of the figures, including FIG. 2 are not necessarily drawn to scale. For example, the flag 23 will generally be smaller than the die to which attaches to it. In addition, the vias are not drawn to scale in the figures. Also there may or may not be plating traces connecting to plating bus 36.

Figure 3:
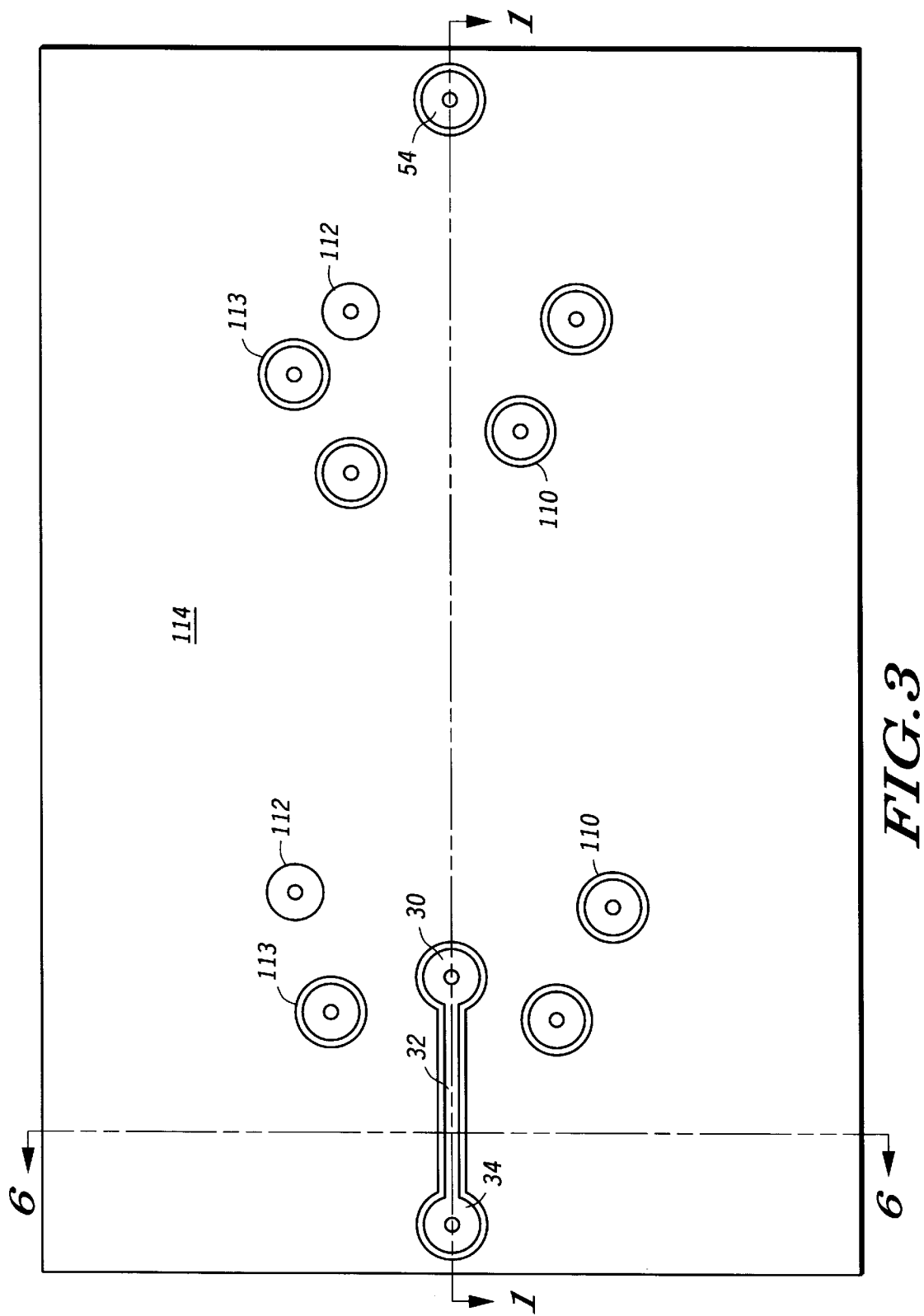
FIG. 3 illustrates a plan view of a conductive layer 4 of the device of FIG. 1.

FIG. 3 illustrates a plan view of layer 4. At layer 4, the vias 34 and 54 are illustrated as isolated vias because they are not electrically connected to a ground or power plane 114 will exist which covers the substantial portion of the surface at layer 4. Also as part of layer 4 is via 30. The via 30, as illustrated in FIG. 1, connects to the solder pad 16. Via 30 contacts trace 32 of layer 4, which subsequently contacts via 34. Via 34 electrically contacts plating bus 36 and 38 to allow electroplating of the solder pad. Also illustrated in FIG. 3 are isolated vias 110 which do not contact the conductive plane 114. Vias 112 in FIG. 3 contact to the ground or power plane 114 of layer 4. An additional feature, which is not illustrated in FIG. 3, would be the addition of an electroplating bus at layer 4. By adding an electroplating bus to layer 4, it is possible to reduce the number of vias between layers 4 and other layers. This is advantageous, because only a minimal number of contacts are necessary to electrically couple the plating bus of layer 4 with the plating bus of layers 2 or 8, therefore, eliminating the number of vias needed overall.

Figure 4:
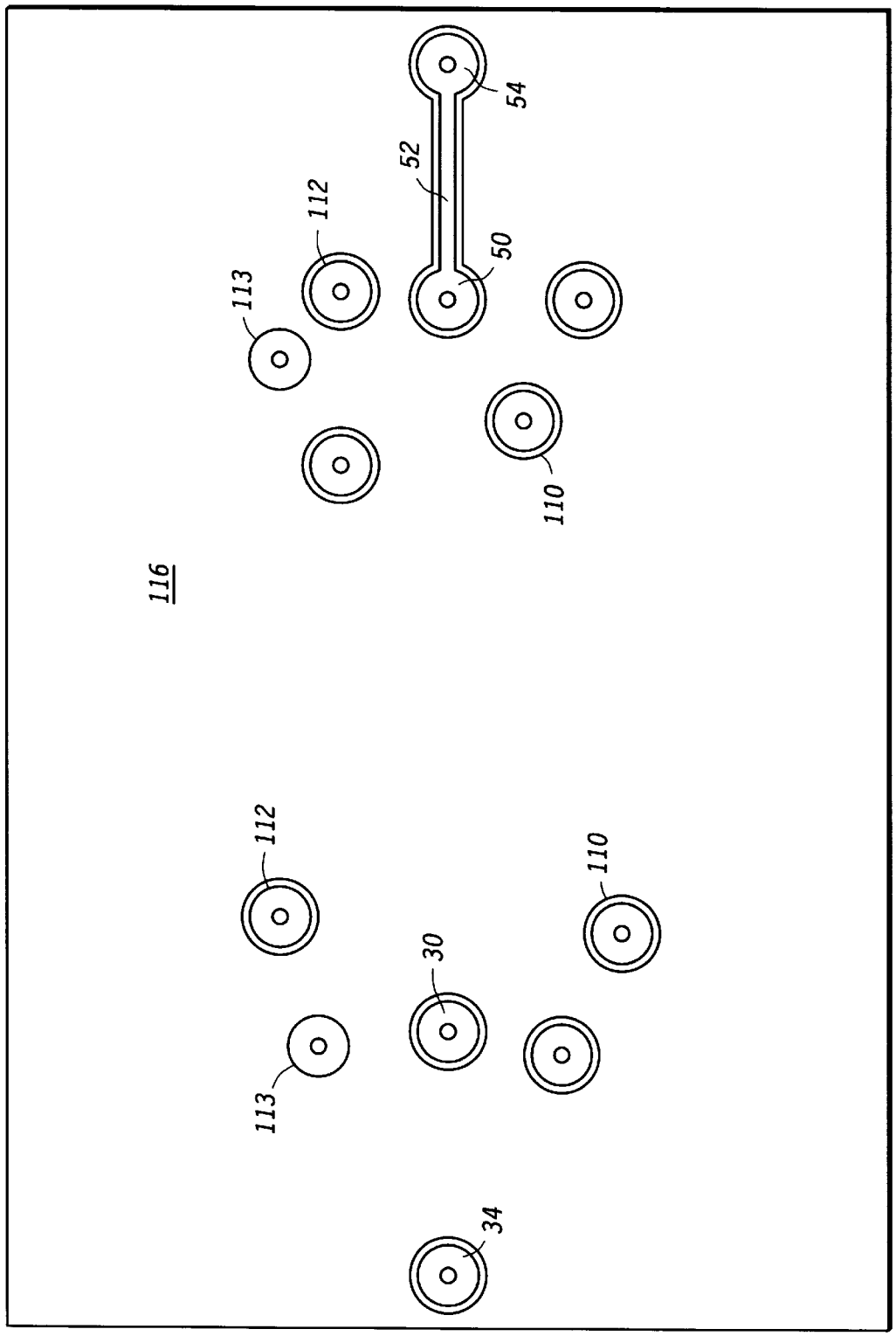
FIG. 4 illustrates a plan view of a conductive layer 6 of the device of FIG. 1.

FIG. 4 illustrates features associated with voltage reference or routing layer 6. Accordingly, the isolated vias 30, 34, 50, 112, 110 and 54 are illustrated as isolated vias. In addition, via 50 makes contact through trace 52 to the via 54. In addition, vias 113 are connected to the plane 116 of FIG. 4.

FIG. 5 illustrates the cross-sectional view of a final package device as indicated in FIG. 3. The cross-sectional view is similar to that of FIG. 1, however, the portion 12 has been removed. Note that the portion 12 may be removed at any time after the bond posts and solder pad have been Nickel/Gold plated. Via 30, which is a through hole via is connected to the metal conductive portion 33 and electrically isolated from metal conductive portion 40. Through hole vias are generally preferred than blind vias due to cost. However, blind vias can be used to reduce the routing density as shown in the case of blind via 50.

FIG. 6, illustrates an end view of a package as indicated in FIG. 2. Visibly detectable at the edge is the molding compound 26, the substrate portion 11 including the traces 32, and 60. By visible, it is understood that the traces 32 and 60 may or may not be visible to the naked eye, requiring magnification to observe the trace 32. In addition, it is understood that the trace 32 may be in an oxidized form. However, in one embodiment, the isolated trace pursuant to the present invention would be visible given a final packaged device once the portion 12 has been exercised during the manufacturing process. In addition, if a sealer material is used on the edges, the traces 32 and 60 would extend only to the edge of the original substrate and not into the sealer material.

Figure 7:
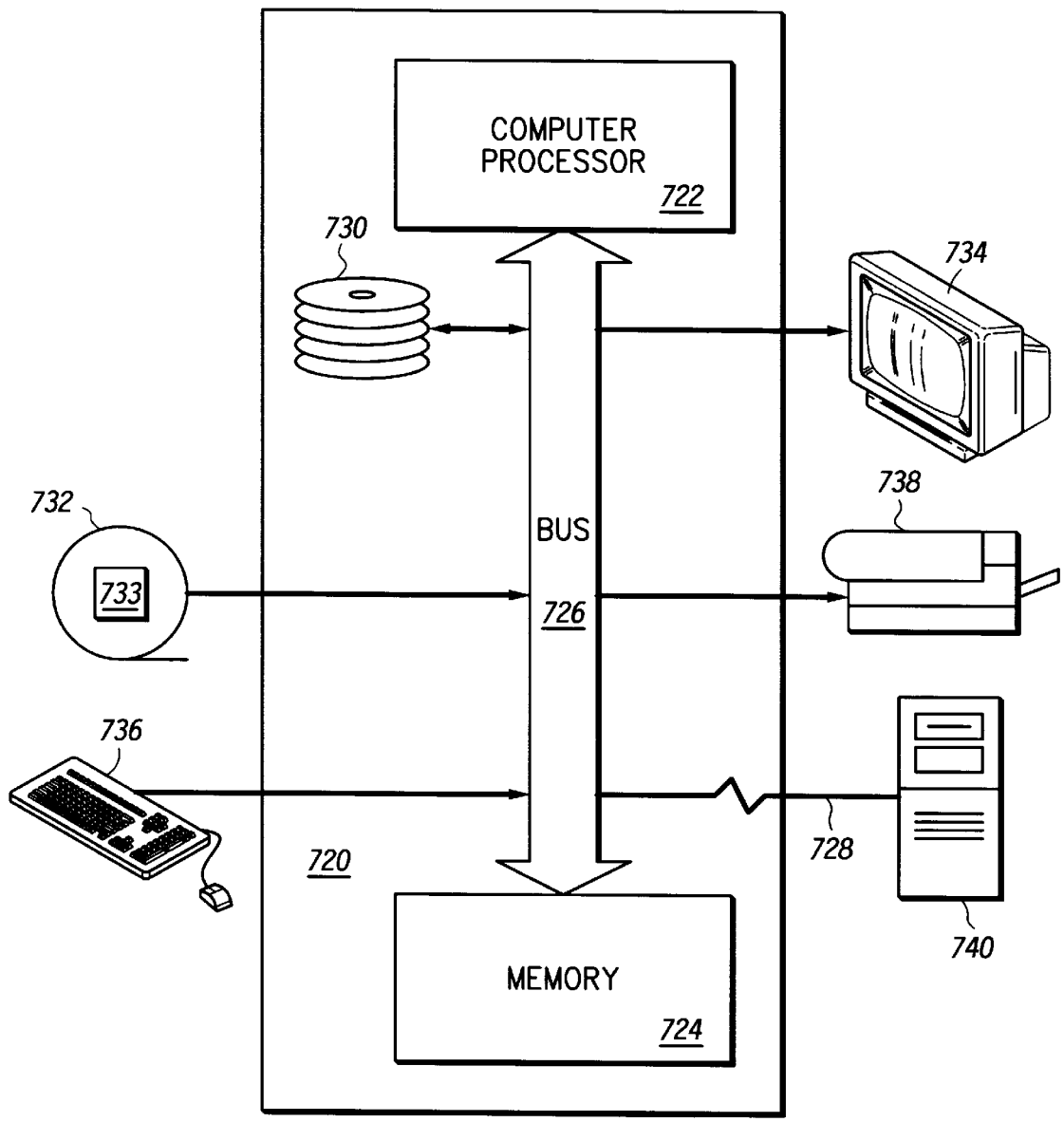
FIG. 7 illustrates a general purpose computer 720 used in making the device of FIG. 5.

FIG. 7 is a block diagram illustrating a General Purpose Computer 720. The General Purpose Computer 720 has a Computer Processor 722, and Memory 724, connected by a Bus 726. Memory 724 is a relatively high speed machine readable medium and includes Volatile Memories such as DRAM, and SRAM, and Non-Volatile Memories such as, ROM, FLASH, EPROM, EEPROM, and bubble memory. Also connected to the Bus are Secondary Storage 730, External Storage 732, output devices such as a monitor 734, input devices such as a keyboard (with mouse) 736, and printers 738. Secondary Storage 730 includes machine readable media such as hard disk drives, magnetic drum, and bubble memory. External Storage 732 includes machine readable media such as floppy disks, removable hard drives, magnetic tape, CD-ROM, and even other computers, possibly connected via a communications line. The distinction drawn here between Secondary Storage 730 and External Storage 732 is primarily for convenience in describing the invention. As such, it should be appreciated that there is substantial functional overlap between these elements. Computer software such Mentor Graphic's Board Station software can be used to design and store packages in a Computer Software Storage Medium, such as memory 724, Secondary Storage 730, and External Storage 732. Executable versions of computer software 733, can be read from a Non-Volatile Storage Medium such as External Storage 732, Secondary Storage 730, and Non-Volatile Memory and loaded for execution directly into Volatile Memory, executed directly out of Non-Volatile Memory, or stored on the Secondary Storage 730 prior to loading into Volatile Memory for execution.

Figure 8:
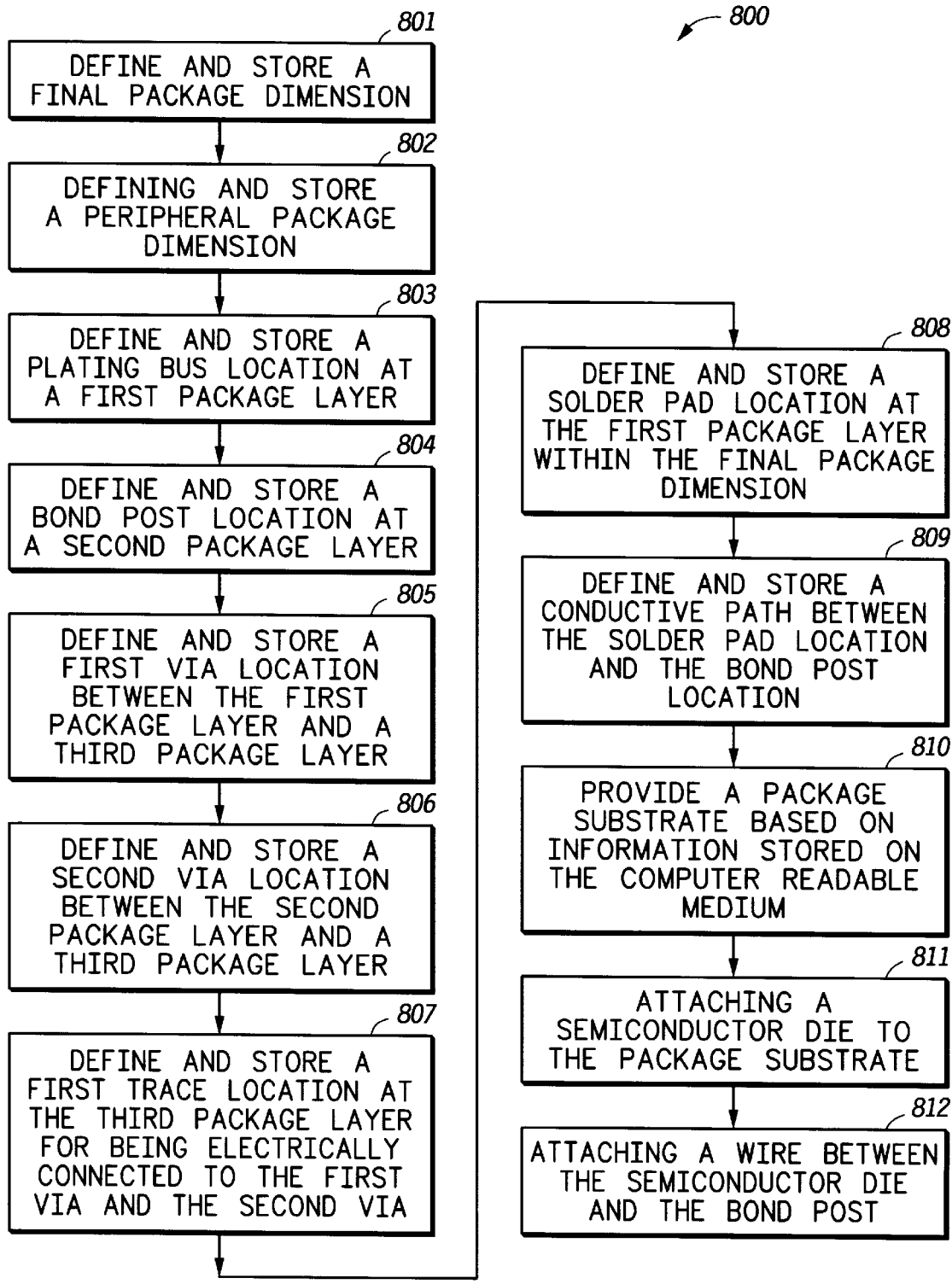
FIG. 8 is a flow diagram for a method making the device of FIG. 5.

The general purpose computer 720 can be used to implement the method of FIG. 8. In step 801 of FIG. 8, a final package dimension is defined and stored within the storage medium of the computer 724, 730, 732. The final package dimension is best illustrated in FIG. 1 as portion 10 of the semiconductor package illustrated. The final package dimension is the portion of the package that remains following completion of all packaging steps.

At step 802, a peripheral package dimension is defined and stored within the computer storage medium 724, 730, 732. The peripheral package portion is illustrated in FIG. 1 as portion 12 which is excised from the package during processing. At step 803, a plating bus location is defined and stored on the computer medium portion 724, 730, 732. The plating bus, in one embodiment, is stored at a first package layer. The first package layer will generally be formed either as part of the top surface of the package substrate or the bottom surface of the package substrate. As previously discussed, the plating bus will generally be a conductive metal trace around the parameter of the surface. At step 804, a bond post is defined and stored in the computer medium 724, 730, 732. The bond post in one embodiment is defined to be at a second package layer. As previously discussed, the bond post locations are used during wire bonding to attach a die bond pad to the package substrate, and can be at the same layer as the plating bus.

At step 805, a first via location is defined between the first package layer and a third package layer. The third package layer is an intermediate layer residing between the first package layer and the second package layer. Therefore, the first via location actually defines a via between the metal layer at which the plating bus resides, and an intermediate layer. Generally, the first via location will be within the peripheral package dimension portion defined in step 802, and forms an electrical contact either directly, or through a subsequent trace, to the plating bus defined by the plating bus location at step 803.

At step 806, a second via location is defined and stored within the computer medium 724, 730, 732. Generally, the second via will be formed in the peripheral package portion defined by step 802 and is electrically connected to the bond post defined by the bond post location of step 804 either directly or through a trace. At step 807, a first trace location is defined and stored on the computer medium 724, 730, 732. Specifically, the first trace location defines a first trace for electrically connecting the first via and the second via together at the third package layer. Since the first via will generally be in the peripheral package portion and the second via will be within the final package portion, the trace or conductive path defined by step 809 will cross the boundary formed between the final package dimension and the peripheral package dimension.

At step 810, a package substrate is provided based upon the information stored on the computer readable medium 724, 730, 732. The manufacturing of semiconductor packages based upon predefined package data bases is well known in the art.

Next, at step 811 a semiconductor die is attached to the second package layer of the package substrate. Generally, at the second package layer there is a conductive die flag formed to which the semiconductor die is attached. However, in other embodiments it is not necessary for the flag to exist, and the die could be attached directly to a dielectric substrate instead of a second package conductive layer. Methods of attaching semiconductor dies to package substrates are well known.

At step 812, a wire bond is attached to the semiconductor die and the bond post. Wire bond equipment used to attach semiconductor die to bond posts would include such as those available from Shinkawa, and K & S.

Subsequent to the step 812, protective and encapsulating material may be placed over die before final testing and shipment of the product. It should be noted, that with reference to the method 800 that the storage medium may be any of a number of storage devices for storing data including volatile and non-volatile memory on removable or non-removable medium.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. For example, it would possible to form solder pads and solder balls on layer 2 of FIG. 1. In the claims, means-plus-function clause(s), if any, cover the structures described herein that perform the recited function(s). The mean-plus-function clause(s) also cover structural equivalents and equivalent structures that perform the recited function(s). In addition, the forgoing discussion and subsequent claims anticipates the use in conjunction with package substrates which have multiple chips attached. Furthermore, Claim elements and steps herein, if have numbered and/or lettered, have been so solely as an aid in readability and understanding. As such, the numbering and/or lettering in itself is not intended to and should not be taken to indicate the ordering of elements and/or steps in the claims.

What is claimed is:

1. A substrate for use in making a semiconductor device, comprising:

a first layer and a second layer over the first layer;

a plurality of bond posts on a first surface of the second layer;

a plurality of solder pads on a first surface of the first layer;

a first plurality of vias, electrically connected to the plurality of solder pads through the first layer from the first surface of the first layer to a second surface of the first layer;

a first plating bus on the first surface of the first layer located at a peripheral portion of the substrate;

a first plurality of traces on the second surface of the first layer connected to the first plurality of vias, wherein a first subset of the first plurality of traces extends to the peripheral portion of the substrate and makes electrical contact in the peripheral portion with the first plating bus;

a second plating bus on the first surface of the second layer located at the peripheral portion of the substrate;

a second plurality of vias, electrically connected to the bond posts, through the second layer from the first surface of the second layer to a second surface of the second layer; and a second plurality of traces on the second surface of the second layer connected to the second plurality of vias, wherein a first subset of the second plurality of traces extend to the peripheral portion of the substrate and make electrical contact in the peripheral portion to the second plating bus.

2. The substrate of claim 1 further comprising a third layer between the first and second layers.

3. A pre-excised packaged device, comprising:

a substrate having a first insulating layer and a second insulating layer over the first insulating layer, said substrate having a main body portion and a peripheral portion for being excised;

a semiconductor die mounted to a first surface of the second insulating layer in the main body portion of the substrate;

a first plurality of metallic pads susceptible to being plated on the first surface of the second layer;

a first plurality of vias through the first insulating layer from the first surface of the first insulating layer to a second surface of the first insulating layer;

a first plating bus on the first surface of the first insulating layer located at a peripheral portion of the substrate; and a first plurality of traces on the second surface of the first layer connected to the first plurality of vias, wherein a first subset of the first plurality of traces extend to the peripheral portion of the substrate and make electrical contact with the first plating bus.

4. The pre-excised packaged device of claim 3, further comprising:

a second plurality of metallic pads on a first surface of the first insulating layer;

a second plating bus on the first surface of the first layer located at the peripheral portion of the substrate;

a second plurality of vias, electrically connected to the second plurality of metallic pads, through the second layer from the first surface of the first insulating layer to a second surface of the first layer; and a second plurality of traces on the second surface of the first layer connected to the second plurality of vias, wherein a first subset of the second plurality of traces extend to the peripheral portion of the substrate and make electrical contact in the peripheral portion to the second plating bus.

5. The pre-excised packaged device of claim 4 further comprising a third insulating layer between the first and second layers.

6. A pre-excised packaged device, comprising:

a substrate having a first insulating layer and a second insulating layer over the first insulating layer, said substrate having a main body portion and a peripheral portion for being excised;

a semiconductor die mounted to a first surface of the second insulating layer in the main body portion of the substrate;

a first plating bus on the first surface of the second insulating layer located at a peripheral portion of the substrate;

a first plurality of metallic pads on the first surface of the second insulating layer;

a plurality of electrical connections from the semiconductor die to the first plurality of metallic pads;

a first via through the first insulating layer from the first surface of the second insulating layer to a second surface of the first insulating layer;

a first metallic contact on the first surface of the second insulating layer between the first via and a first metallic pad of the first plurality of metallic pads;

a second via through the first insulating layer from the first surface of the second insulating layer to the second surface of the first insulating layer and electrically connected to the first plating bus; and a first conductive trace on the second surface of the second insulating layer connected to the first via and the second via.

7. The pre-excised packaged device of claim 6, further comprising:

a second plating bus on the first surface of the first insulating layer located at the peripheral portion of the substrate;

a second plurality of metallic pads on the first surface of the first insulating layer;

a third via through the second insulating layer from the first surface of the first insulating layer to a second surface of the first insulating layer;

a second metallic contact on the first surface of the first insulating layer between the third via and a first metallic pad of the second plurality of metallic pads;

a fourth via through the first insulating layer from the first surface of the first insulating layer to the second surface of the first insulating layer and electrically connected to the second plating bus; and a second conductive trace on the second surface of the first insulating layer connected to the third via and the fourth via.

8. The pre-excised packaged device of claim 7, further comprising:

a third insulating layer between the first insulating layer and the second insulating layer.

* * * * *